United States Patent
Aoki et al.

(10) Patent No.: US 9,994,743 B2
(45) Date of Patent: Jun. 12, 2018

(54) ADHESIVE AND LIGHT-EMITTING DEVICE

(71) Applicant: DEXERIALS CORPORATION, Shinagawa-ku (JP)

(72) Inventors: Masaharu Aoki, Shinagawa-ku (JP); Shiyuki Kanisawa, Shinagawa-ku (JP); Hidetsugu Namiki, Shinagawa-ku (JP); Taichi Koyama, Shinagawa-ku (JP); Akira Ishigami, Shinagawa-ku (JP)

(73) Assignee: DEXERIALS CORPORATION, Shinagawa-ku (JP)

( * ) Notice: Subject to any disclaimer, the term of this patent is extended or adjusted under 35 U.S.C. 154(b) by 0 days. days.

(21) Appl. No.: 14/916,490

(22) PCT Filed: Sep. 9, 2014

(86) PCT No.: PCT/JP2014/073799
§ 371 (c)(1),
(2) Date: Mar. 3, 2016

(87) PCT Pub. No.: WO2015/037579
PCT Pub. Date: Mar. 19, 2015

(65) Prior Publication Data
US 2016/0194531 A1    Jul. 7, 2016

(30) Foreign Application Priority Data
Sep. 13, 2013    (JP) ................ 2013-190129

(51) Int. Cl.
*H01L 21/12* (2006.01)
*C09J 133/20* (2006.01)
(Continued)

(52) U.S. Cl.
CPC ........... *C09J 133/20* (2013.01); *C08F 220/18* (2013.01); *C09J 9/02* (2013.01); *C09J 133/066* (2013.01);
(Continued)

(58) Field of Classification Search
CPC ... H01L 21/6836; H01L 21/268; H01L 21/78; H01L 21/561
(Continued)

(56) References Cited

U.S. PATENT DOCUMENTS 5,476,752 A * 12/1995 Noguchi ................ G03F 7/032
430/287.1
2010/0173164 A1    7/2010 Yoshida
(Continued)

FOREIGN PATENT DOCUMENTS

EP    2 161 739 A1    3/2010
JP    62-000520 A    1/1987
(Continued)

OTHER PUBLICATIONS

International Search Report dated Dec. 22, 2014 for PCT/JP2014/073799 filed Sep. 9, 2014.
(Continued)

*Primary Examiner* — Julio J Maldonado
*Assistant Examiner* — Rodolfo D. Fortich
(74) *Attorney, Agent, or Firm* — Oblon, McClelland, Maier & Neustadt, L.L.P.

(57) ABSTRACT

This adhesive contains an epoxy compound, a cationic catalyst, and an acrylic resin that includes acrylic acid and an acrylic acid ester having a hydroxyl group. The acrylic acid in the acrylic resin reacts with the epoxy compound, creating a link between the acrylic resin island part and the epoxy compound sea part, and strengthening the anchoring effect with respect to the epoxy compound sea part by roughening the surface of an oxide film. Furthermore, the hydroxyl-group-containing acrylic acid ester in the acrylic resin becomes electrostatically adhesive to wiring due to the polarity of the hydroxyl group. Excellent adhesive strength can be obtained by adhering, in this way, the entire cured
(Continued)

product composed of the acrylic resin island part and the epoxy compound sea part to the oxide film.

20 Claims, 4 Drawing Sheets (51) Int. Cl.
  *C09J 163/00* (2006.01)
  *H01L 23/00* (2006.01)
  *H01L 33/62* (2010.01)
  *H01B 1/22* (2006.01)
  *C09J 133/06* (2006.01)
  *C09J 9/02* (2006.01)
  *C08F 220/18* (2006.01)

(52) U.S. Cl.
  CPC .............. *C09J 163/00* (2013.01); *H01B 1/22* (2013.01); *H01L 24/29* (2013.01); *H01L 24/81* (2013.01); *H01L 24/83* (2013.01); *H01L 33/62* (2013.01); *C08L 2205/22* (2013.01); *H01L 24/13* (2013.01); *H01L 24/16* (2013.01); *H01L 24/32* (2013.01); *H01L 2224/16227* (2013.01); *H01L 2224/294* (2013.01); *H01L 2224/2929* (2013.01); *H01L 2224/2936* (2013.01); *H01L 2224/2939* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29371* (2013.01); *H01L 2224/29387* (2013.01); *H01L 2224/29388* (2013.01); *H01L 2224/29393* (2013.01); *H01L 2224/32225* (2013.01); *H01L 2224/81424* (2013.01); *H01L 2224/81487* (2013.01); *H01L 2224/81903* (2013.01); *H01L 2224/83424* (2013.01); *H01L 2224/83487* (2013.01); *H01L 2224/83851* (2013.01); *H01L 2224/83862* (2013.01); *H01L 2924/07811* (2013.01); *H01L 2924/12041* (2013.01); *H01L 2924/181* (2013.01); *H01L 2933/0066* (2013.01)

(58) Field of Classification Search
  USPC ............................... 257/79, 98, 99, 783, 777
  See application file for complete search history.

(56) References Cited

U.S. PATENT DOCUMENTS

| | | | |
|---|---|---|---|
| 2011/0086980 | A1 | 4/2011 | Fung et al. |
| 2013/0264602 | A1 | 10/2013 | Namiki et al. |
| 2014/0097463 | A1 | 4/2014 | Namiki et al. |

FOREIGN PATENT DOCUMENTS

| | | | |
|---|---|---|---|
| JP | 09-291267 | A | 11/1997 |
| JP | 11-140388 | A | 5/1999 |
| JP | 2004-224873 | A | 8/2004 |
| JP | 2005-146038 | A | 6/2005 |
| JP | 2008-214449 | A | 9/2008 |
| JP | 2010-024301 | A | 2/2010 |
| JP | 2012-186322 | A | 9/2012 |
| WO | WO 2013/008680 | A1 | 1/2013 |

OTHER PUBLICATIONS

Extended European Search Report dated Mar. 13, 2017 in Patent Application No. 14844800.4.

* cited by examiner

ADHESIVE AND LIGHT-EMITTING DEVICE

TECHNICAL FIELD

The present invention relates to adhesives for electrically connecting electronic components together, and particularly to an adhesive for connecting a light-emitting element, such as a light-emitting diode (LED), to a wiring substrate and to a light-emitting device including a wiring substrate and a light-emitting element connected together.

BACKGROUND ART

One of the widely used techniques for mounting chip components such as LEDs on circuit boards is flip-chip mounting with anisotropic conductive films (ACFs), which are prepared by dispersing conductive particles in an epoxy adhesive and forming the resulting dispersion into a film (see, for example, PTLs 1 and 2). This technique, which provides electrical connections between chip components and circuit boards through the conductive particles in anisotropic conductive films, requires a shorter connection process and thus allows for improved productivity.

CITATION LIST

Patent Literature

PTL 1: Japanese Unexamined Patent Application Publication No. 2010-24301
PTL 2: Japanese Unexamined Patent Application Publication No. 2012-186322

SUMMARY OF INVENTION

Technical Problem

To achieve a lower cost, some recent LED products are fabricated on circuit boards having Al or Cu wiring instead of Au or Ag wiring, whereas others are fabricated on polyethylene terephthalate (PET) transparent substrates having indium tin oxide (ITO) wiring formed thereon.

Unfortunately, metal wiring such as Al or Cu wiring and ITO wiring are not suitable for bonding with conventional epoxy adhesives since they are covered with oxide films such as passivation films and oxidized films.

In view of the foregoing problems with the related art, an object of the present invention is to provide an adhesive with excellent adhesion to oxide films and a light-emitting device fabricated using such an adhesive.

Solution to Problem

To solve the foregoing problems, an adhesive according to the present invention contains an alicyclic epoxy compound or hydrogenated epoxy compound, a cationic catalyst, and an acrylic resin having a weight average molecular weight of 50,000 to 900,000. The acrylic resin contains 0.5% to 10% by weight of acrylic acid and 0.5% to 10% by weight of a hydroxyl-group-containing acrylic acid ester.

A light-emitting device according to the present invention includes a substrate having a wiring pattern made of aluminum, an anisotropic conductive film formed on an electrode of the wiring pattern, and a light-emitting element mounted on the anisotropic conductive film. The anisotropic conductive film is a cured product of an anisotropic conductive adhesive containing an alicyclic epoxy compound or hydrogenated epoxy compound, a cationic catalyst, an acrylic resin having a weight average molecular weight of 50,000 to 900,000, and conductive particles. The acrylic resin contains 0.5% to 10% by weight of acrylic acid and 0.5% to 10% by weight of a hydroxyl-group-containing acrylic acid ester.

A light-emitting device according to the present invention includes a transparent substrate having a wiring pattern made of a transparent conductive film, an anisotropic conductive film formed on an electrode of the wiring pattern, and a light-emitting element mounted on the anisotropic conductive film. The anisotropic conductive film is a cured product of an anisotropic conductive adhesive containing an alicyclic epoxy compound or hydrogenated epoxy compound, a cationic catalyst, an acrylic resin having a weight average molecular weight of 50,000 to 900,000, and conductive particles. The acrylic resin contains 0.5% to 10% by weight of acrylic acid and 0.5% to 10% by weight of a hydroxyl-group-containing acrylic acid ester.

Advantageous Effects of Invention

According to the present invention, the addition of an acrylic resin containing acrylic acid and a hydroxyl-group-containing acrylic acid ester allows the entire cured product to be bonded to an oxide film, thus providing excellent adhesive strength.

DESCRIPTION OF EMBODIMENTS

An embodiment of the present invention (hereinafter referred to as "the present embodiment") will now be described in detail with reference to the drawings in the following order. It should be appreciated, however, that the invention is not limited to the following embodiment; various modifications are possible without departing from the spirit of the invention. The drawings are schematic and not necessarily drawn to scale, and the specific sizes of the elements, for example, should be determined based on the following description. It should also be appreciated that the dimensional relationship and proportion of the elements may differ in different figures.

1. Adhesive
2. Light-Emitting Device
3. Examples

<1. Adhesive>

An adhesive according to the present invention contains an alicyclic epoxy compound or hydrogenated epoxy compound, a cationic catalyst, and an acrylic resin having a weight average molecular weight of 50,000 to 900,000. The acrylic resin contains 0.5% to 10% by weight of acrylic acid and 0.5% to 10% by weight of a hydroxyl-group-containing acrylic acid ester.

Figure 1:
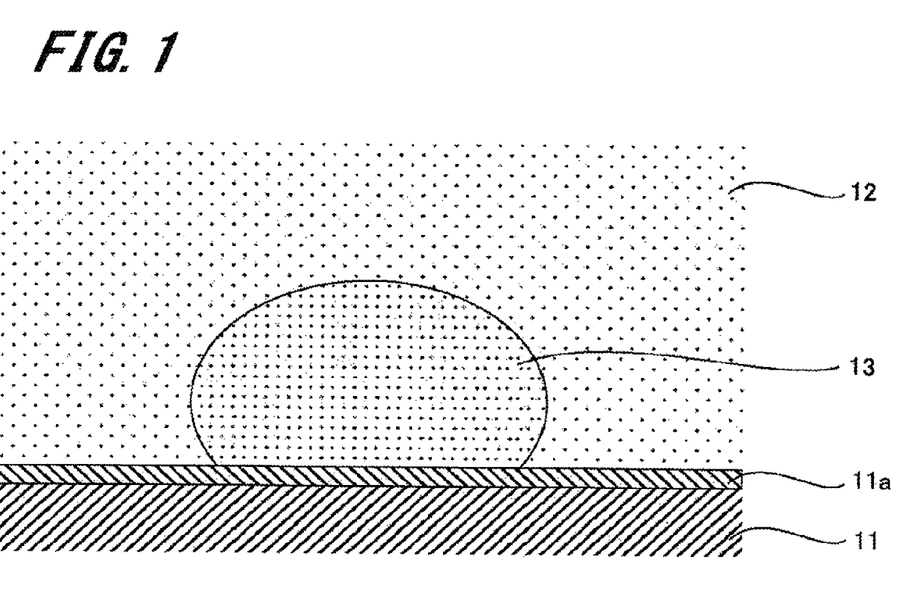
FIG. 1 is a sectional view illustrating a sea-island model including an epoxy compound sea part and acrylic resin island parts.

FIG. 1 is a sectional view of an interface between the adhesive and an oxide film, illustrating a sea-island model including an epoxy compound sea part and acrylic resin island parts. This sea-island model is a cured product model illustrating the state where acrylic resin island parts 13 dispersed in an epoxy compound sea part 12 are in contact with an oxide film 11a on wiring 11.

In this cured product model, the acrylic acid in the acrylic resin reacts with the epoxy compound to form links between the acrylic resin island parts 13 and the epoxy compound sea part 12 and also roughens the surface of the oxide film 11a to enhance the anchoring effect on the epoxy compound sea part 12. The hydroxyl-group-containing acrylic acid ester in the acrylic resin also produces electrostatic adhesion to the wiring 11 due to the polarity of the hydroxyl groups. In this way, the entire cured product of the acrylic resin island parts 13 and the epoxy compound sea part 12 can be bonded to the oxide film 11a, thus providing excellent adhesive strength.

Preferred alicyclic epoxy compounds include those having two or more epoxy groups in the molecule. Both liquid alicyclic epoxy compounds and solid alicyclic epoxy compounds may be used. Examples of alicyclic epoxy compounds include 3,4-epoxycyclohexenylmethyl 3',4'-epoxycyclohexenecarboxylate and glycidyl hexahydrobisphenol A. Among these, 3,4-epoxycyclohexenylmethyl 3',4'-epoxycyclohexenecarboxylate is preferred since it forms a cured product with optical transparency suitable for applications such as the mounting of LED elements and also has fast-curing properties.

Examples of hydrogenated epoxy compounds that can be used include hydrogenated products of alicyclic epoxy compounds as described above and known hydrogenated epoxy compounds such as hydrogenated bisphenol A epoxy compounds and hydrogenated bisphenol F epoxy compounds.

The alicyclic epoxy compounds and the hydrogenated epoxy compounds may be used alone or in combination. These epoxy compounds may be used in combination with other epoxy compounds, provided that they do not interfere with the advantages of the present invention. Examples of such epoxy compounds include known epoxy resins such as glycidyl ethers obtained by reacting, with epichlorohydrin, polyhydric phenols such as bisphenol A, bisphenol F, bisphenol S, tetramethylbisphenol A, diarylbisphenol A, hydroquinone, catechol, resorcinol, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol novolac, and cresol novolac; polyglycidyl ethers obtained by reacting, with epichlorohydrin, aliphatic polyhydric alcohols such as glycerol, neopentyl glycol, ethylene glycol, propylene glycol, tylene glycol, hexylene glycol, polyethylene glycol, and polypropylene glycol; glycidyl ether esters obtained by reacting, with epichlorohydrin, hydroxycarboxylic acids such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, endomethylenetetrahydrophthalic acid, endomethylenehexahydrophthalic acid, trimellitic acid, and polymeric fatty acids; glycidylaminoglycidyl ethers obtained from aminophenols and aminoalkylphenols; glycidylaminoglycidyl esters obtained from aminobenzoic acids; glycidylamines obtained from compounds such as aniline, toluidine, tribromoaniline, xylylenediamine, diaminocyclohexane, bisaminomethylcyclohexane, 4,4'-diaminodiphenylmethane, and 4,4'-diaminodiphenylsulfone; and epoxylated polyolefins.

Examples of cationic catalysts that can be used include latent cationic curing agents such as aluminum chelate latent curing agents, imidazole latent curing agents, and sulfonium latent curing agents. Among these, aluminum chelate latent curing agents are preferred for their fast-curing properties.

The cationic catalyst is preferably present in an amount of 0.1 to 30 parts by mass, more preferably 0.5 to 20 parts by mass, per 100 parts by weight of the epoxy compound. If the cationic catalyst is present in insufficient amounts, the adhesive loses its reactivity. If the cationic catalyst is present in excess amounts, the adhesive tends to have a shorter product life.

The acrylic resin has a weight average molecular weight of 50,000 to 900,000. There is a correlation between the weight average molecular weight of the acrylic resin and the size of the acrylic resin island parts 13 in the cured product model shown in FIG. 1. If the acrylic resin has a weight average molecular weight of 50,000 to 900,000, acrylic resin island parts 13 of suitable size can be brought into contact with the oxide film 11a. If the acrylic resin has a weight average molecular weight of less than 50,000, the acrylic resin island parts 13 have a limited contact area with the oxide film 11a and thus fail to provide the effect of improving the adhesive strength. If the acrylic resin has a weight average molecular weight of more than 900,000, large acrylic resin island parts 13 are formed, which would not allow the entire cured product of the acrylic resin island parts 13 and the epoxy compound sea part 12 to be bonded to the oxide film 11a, thus resulting in decreased adhesive strength.

Acrylic acid is present in the acrylic resin in an amount of 0.5% to 10% by weight, preferably 1 to 5% by weight. If acrylic acid is present in the acrylic resin in an amount of 0.5% to 10% by weight, it reacts with the epoxy compound to form links between the acrylic resin island parts 13 and the epoxy compound sea part 12 and also roughens the surface of the oxide film 11a to enhance the anchoring effect on the epoxy compound sea part 12.

The hydroxyl-group-containing acrylic acid ester is present in the acrylic resin in an amount of 0.5% to 10% by weight, preferably 1% to 5% by weight. If the hydroxyl-group-containing acrylic acid ester is present in the acrylic resin in an amount of 0.5% to 10% by weight, it produces electrostatic adhesion to the wiring 11 due to the polarity of the hydroxyl groups.

The hydroxyl-group-containing acrylic acid ester may be at least one acrylic acid ester selected from the group consisting of 2-hydroxyethyl methacrylate, 2-hydroxypropyl methacrylate, 2-hydroxyethyl acrylate, and 2-hydroxypropyl acrylate. Among these, 2-hydroxyethyl methacrylate is preferred for its excellent adhesion to oxide films.

In addition to acrylic acid and the hydroxyl-group-containing acrylic acid ester, the acrylic resin contains an acrylic acid ester containing no hydroxy group. Examples of acrylic acid esters containing no hydroxy group include butyl acrylate, ethyl acrylate, and acrylonitrile. Preferably, the acrylic resin contains at least one acrylic ester selected from butyl acrylate, ethyl acrylate, and acrylonitrile.

The acrylic resin is preferably present in an amount of 1 to 10 parts by mass, more preferably 1 to 5 parts by mass, per 100 parts by mass of the epoxy compound. If the acrylic resin is present in an amount of 1 to 10 parts by mass per 100 parts by mass of the epoxy compound, the acrylic resin island parts 12 in the resulting cured product are dispersed at an appropriate density in the epoxy compound sea part 13.

The adhesive according to the present invention may further contain, as another component, a silane coupling agent for improving the interfacial adhesion to inorganic materials. Examples of silane coupling agents include epoxy, methacryloxy, amino, vinyl, mercapto/sulfide, and ureide silane coupling agents. These silane coupling agents may be used alone or in combination. Among these, epoxy silane coupling agents are preferred in the present embodiment.

The adhesive may further contain an inorganic filler for controlling the flowability and thereby improving the particle capture performance. Examples of inorganic fillers include, but not limited to, silica, talc, titanium oxide, calcium carbonate, and magnesium oxide. These inorganic fillers may optionally be used to alleviate the stress on connection structures in which connections are made by the adhesive. The adhesive may further contain other ingredients such as thermoplastic resins and softeners such as rubbers.

This adhesive provides high adhesive strength to metals that are not suitable for bonding, including aluminum.

The adhesive may be an anisotropic conductive adhesive containing conductive particles. The conductive particles may be known conductive particles. Examples of conductive particles include particles of various metals such as nickel, iron, copper, aluminum, tin, lead, chromium, cobalt, silver, and gold and alloys thereof; metal-coated particles of materials such as metal oxides, carbon, graphite, glass, ceramics, and plastics; and those further coated with insulating thin films. If the conductive particles are metal-coated resin particles, resin particles such as epoxy, phenolic, acrylic, acrylonitrile-styrene (AS), benzoguanamine, divinylbenzene, and styrene resin particles may be used.

The average particle size of the conductive particles is typically 1 to 10 μm, preferably 2 to 6 μm. The average particle density of the conductive particles in the adhesive is preferably 1,000 to 100,000 particles/mm$^2$, more preferably 30,000 to 80,000 particles/mm$^2$, for reasons of connection reliability and insulation reliability.

This anisotropic conductive adhesive provides high connection reliability for aluminum wiring and ITO wiring covered with oxide films.

<2. Light-Emitting Device>

Figure 2:
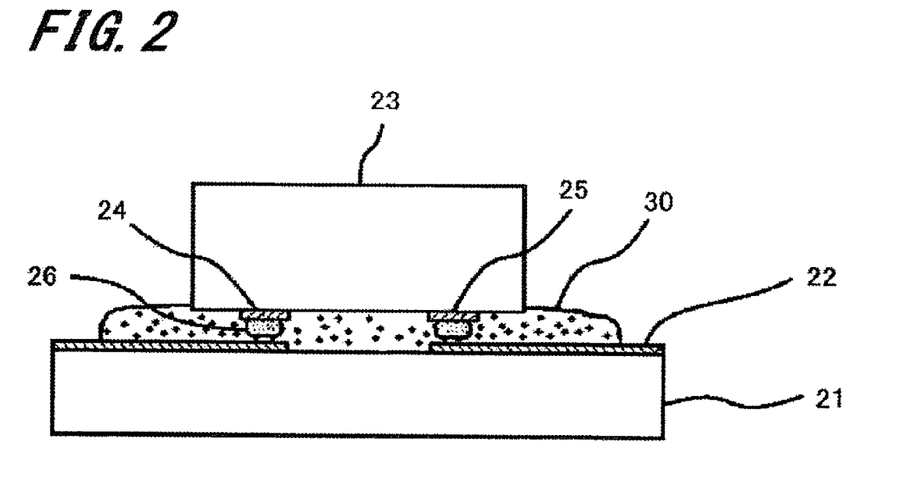
FIG. 2 is a sectional view of an example light-emitting device.

A light-emitting device according to the present invention will now be described. FIG. 2 is a sectional view of an example light-emitting device. The light-emitting device includes a substrate 21 having a wiring pattern 22, an anisotropic conductive film 30 formed on the electrodes of the wiring pattern 22, and a light-emitting element 23 mounted on the anisotropic conductive film 30. The anisotropic conductive film 30 is made of a cured product of the anisotropic conductive adhesive described above. The light-emitting device is obtained by applying the anisotropic conductive adhesive described above between the wiring pattern 22 on the substrate 21 and connection bumps 26 formed on an n-electrode 24 and a p-electrode 25 of an LED element serving as the light-emitting element 23 and then flip-chip mounting the light-emitting element 23 on the substrate 21.

In the present embodiment, the anisotropic conductive adhesive described above allows the effective use of substrates having wiring patterns made of aluminum. This results in a reduction in the cost of LED products.

The anisotropic conductive adhesive also allows the effective use of transparent substrates having wiring patterns made of transparent conductive films such as ITO films. For example, the anisotropic conductive adhesive can be used to mount LEDs on polyethylene terephthalate (PET) transparent substrates having indium tin oxide (ITO) wiring formed thereon.

Optionally, the LED 23 may be sealed with a transparent mold resin by covering the entire LED 23 with the resin. The LED 23 may further include a light reflective layer. Known light-emitting elements other than LEDs may also be used, provided that they do not interfere with the advantages of the present invention.

<3. Examples>

EXAMPLES

Examples of the present invention will now be described. In these examples, various anisotropic conductive adhesives were prepared and evaluated for their color, total reflectance, and peel strength. Mounted LED samples were also fabricated by mounting LED chips on substrates using the anisotropic conductive adhesives and were evaluated for their die shear strength and conduction resistance. It should be noted, however, that these examples are not intended to limit the invention.

[Evaluation of Color]

The anisotropic conductive adhesives were applied to a thickness of 100 μm on white ceramic sheets and were cured by heating at 180° C. for 30 seconds. The cured coatings were tested for their whiteness using a colorimeter (JIS P 8148). Coatings having a whiteness of 70% or more were evaluated as "white". Coatings having a whiteness of less than 70% were evaluated for their color by visual inspection.

[Measurement of Total Reflectance]

The anisotropic conductive adhesives were applied to a thickness of 100 μm on white ceramic sheets and were cured by heating at 180° C. for 30 seconds. The cured coatings were tested for their total reflectance (specular reflection and diffused reflection) for light at a wavelength of 460 nm relative to that of barium sulfate using a spectrophotometer (UV3100, Shimadzu Corporation). The cured coatings were also tested for their total reflectance for light at a wavelength of 460 nm after a heat resistance test at 100° C. for 1,000 hours. A light reflectance of more than 30% is desirable in practical use.

[Measurement of Peel Strength]

The anisotropic conductive adhesives were applied to a thickness of 100 μm on white ceramic sheets. Aluminum pieces having a size of 1.5 mm×10 mm were then bonded to the sheets by heat pressing at 180° C. and 1.5 N for 30 seconds.

Figure 3:
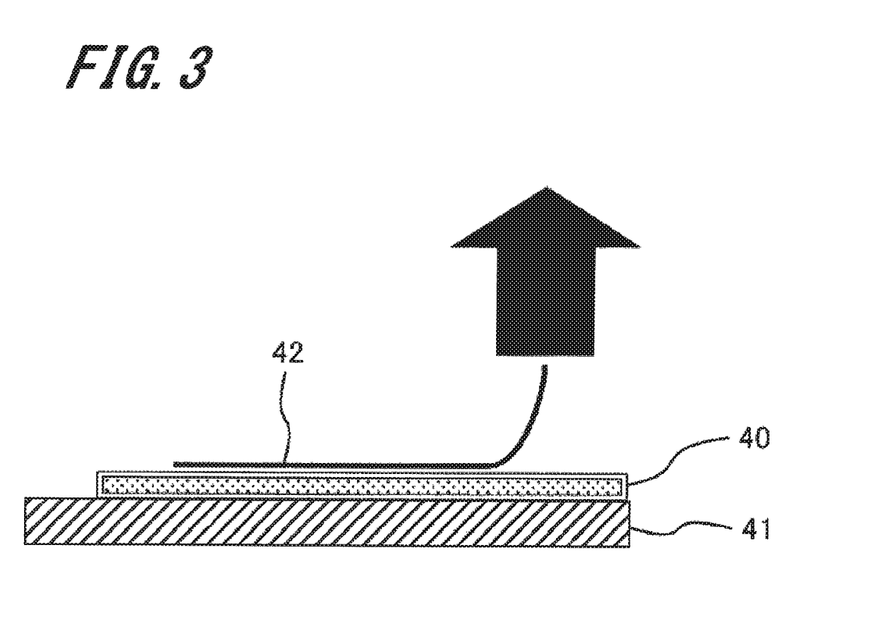
FIG. 3 is a sectional view illustrating the outline of a 90° peel strength test.

As shown in FIG. 3, an aluminum piece 42 was stripped from the sheet at a speed of 50 mm/sec in the 90° Y-axis direction using a Tensilon tester. The maximum peel strength required to strip the aluminum piece 42 was measured.

[Fabrication of Mounted LED Sample]

Figure 4:
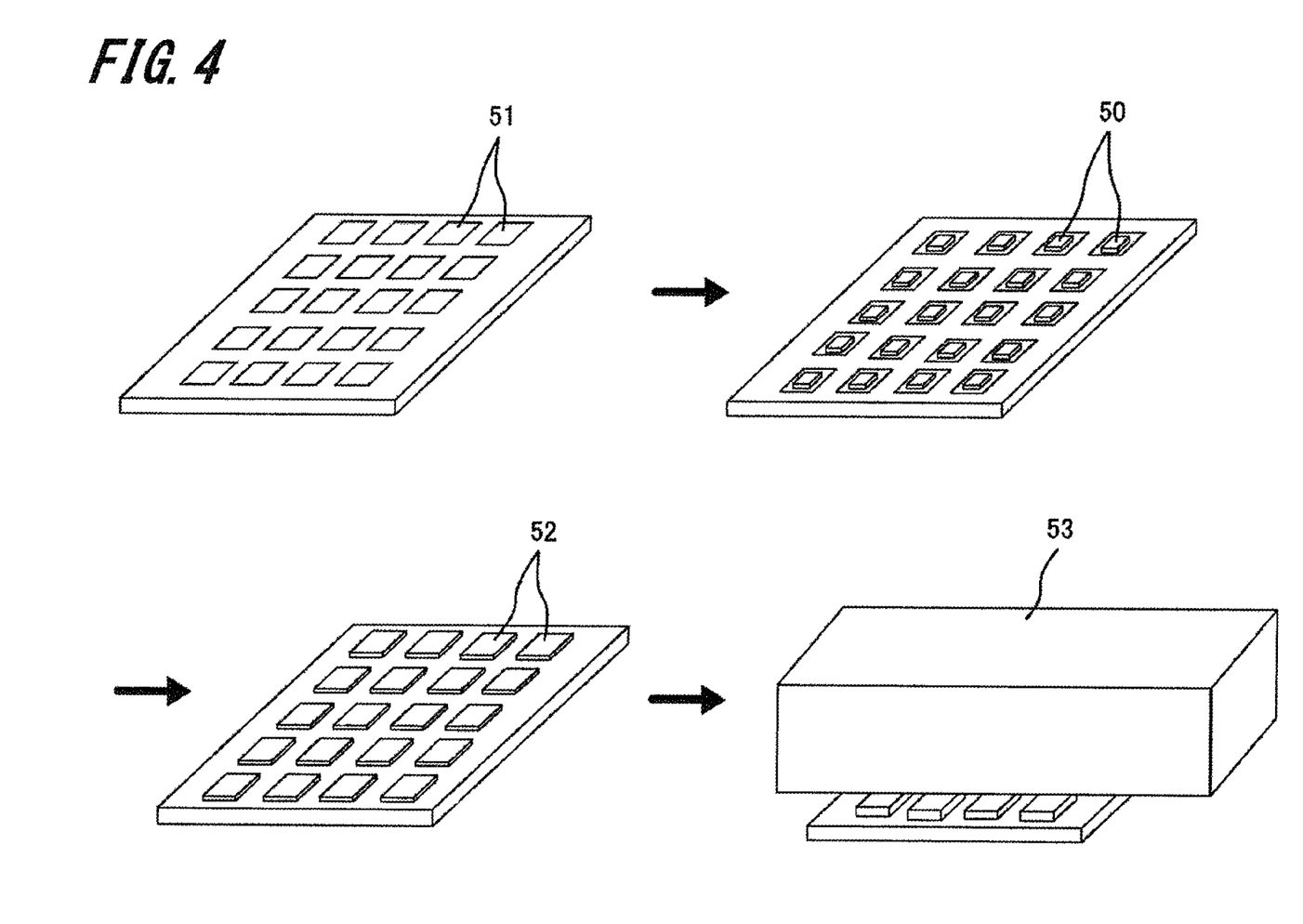
FIG. 4 illustrates a process of fabricating mounted LED samples.

Mounted LED samples were fabricated as shown in FIG. 4. A plurality of wiring substrates (50 μm Al wiring-25 μm polyimide (PI) layer-50 μm Al base) 51 with a pitch of 50 μm were arranged on a stage and were coated with about 10 μg of an anisotropic conductive adhesive 50. LED chips available from Cree, Inc. (trade name: DA3547, maximum rated current: 150 mA, size: 0.35 mm×0.46 mm) 52 were mounted on the anisotropic conductive adhesive 50 by flip chip mounting using a heat pressing tool 53 to obtain mounted LED samples.

The wiring substrate used in Example 5 had an ITO wiring pattern with a pitch of 50 μm (50 μm ITO wiring-25 μm polyimide (PI) layer-50 μm Al base).

[Measurement of Die Shear Strength]

Figure 5:
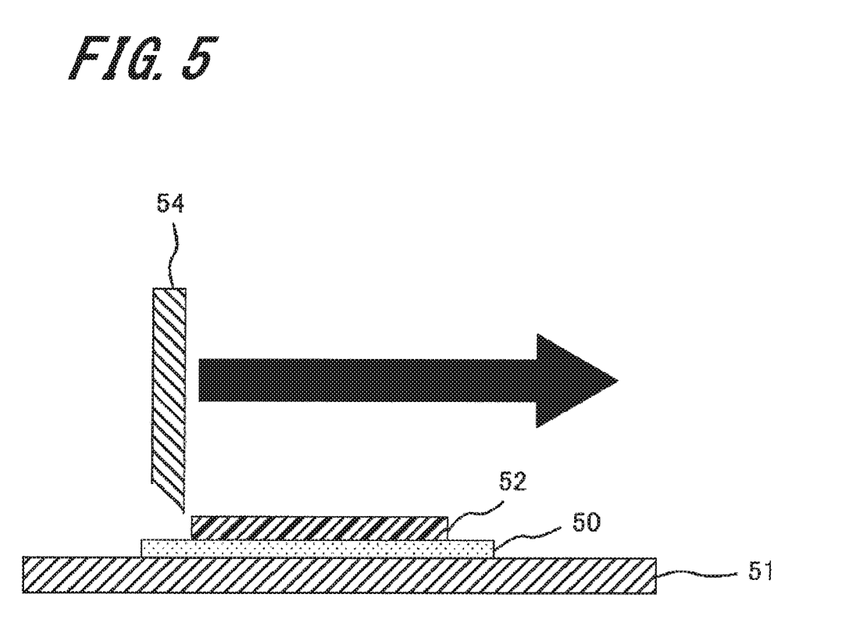
FIG. 5 is a sectional view illustrating the outline of a die shear strength test.

As shown in FIG. 5, the mounted LED samples were tested for their bonding strength at 25° C. using a die shear tester. The speed of a tool 54 was 20 μm/sec.

[Evaluation of Conduction Resistance]

The mounted LED samples were tested for their initial conduction resistance, conduction resistance after a temperature cycle test (TCT), conduction resistance after an environmental test at 100° C. for 1,000 hours, and conduction resistance after an environmental test at 60° C. and 90% RH for 500 hours. In the temperature cycle test, the conduction resistance of the mounted LED samples was measured after 100, 500, and 1,000 temperature cycles, each cycle including 30 minutes of exposure to an atmosphere at −40° C. and 30 minutes of exposure to an atmosphere at 100° C. The conduction resistance was evaluated based on the Vf measured at an If of 50 mA. Mounted LED samples that exhibited an increase in Vf of less than 5% from the Vf in the test result table were rated as "good". Mounted LED samples that exhibited an increase in Vf of 5% or more from the Vf in the test result table were rated as "poor".

[Overall Evaluation]

Anisotropic conductive adhesives that were white, that had a total reflectance of 70% or more both initially and after an environmental test at 100° C. for 1,000 hours, a peel strength of 2.0 N or more both initially and after an environmental test at 60° C. and 90% RH for 500 hours, and a die shear strength of 5.0 N or more both initially and after an environmental test at 60° C. and 90% RH for 500 hours, and that were rated as "good" for all conductivity evaluations were rated as "good". Others were rated as "poor".

Example 1

An anisotropic conductive adhesive was prepared by dispersing 10 parts by mass of conductive particles (AUL704, Sekisui Chemical Co., Ltd.) in an adhesive containing 100 parts by mass of an alicyclic epoxy compound (Celloxide 2021P, Daicel Corporation), 5 parts by mass of a latent cationic curing agent (aluminum chelate latent curing agent), and 3 parts by mass of an acrylic resin (butyl acrylate (BA): 15%, ethyl acrylate (EA): 63%, acrylonitrile (AN): 20%, acrylic acid (AA): 1 w %, 2-hydroxyethyl methacrylate (HEMA): 1 wt %, weight average molecular weight Mw: 700,000). A mounted LED sample was fabricated by curing the anisotropic conductive adhesive at 180° C. and 1.5 N for 30 seconds.

Table 1 shows the evaluation results for Example 1. The anisotropic conductive adhesive was white and had an initial total reflectance of 75% and a total reflectance of 74% after an environmental test at 100° C. for 1,000 hours. The anisotropic conductive adhesive also had an initial peel strength of 4.0 N and a peel strength of 4.1 N after an environmental test at 60° C. and 90% RH for 500 hours. The mounted LED sample had an initial die shear strength of 8.5 N and a die shear strength of 5.3 N after an environmental test at 60° C. and 90% RH for 500 hours. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "good" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "good".

Example 2

An anisotropic conductive adhesive was prepared as in Example 1 except that the acrylic resin had a weight average molecular weight Mw of 500,000 and was used to obtain a mounted LED sample.

Table 1 shows the evaluation results for Example 2. The anisotropic conductive adhesive was white and had an initial total reflectance of 73% and a total reflectance of 73% after an environmental test at 100° C. for 1,000 hours. The anisotropic conductive adhesive also had an initial peel strength of 3.1 N and a peel strength of 2.9 N after an environmental test at 60° C. and 90% RH for 500 hours. The mounted LED sample had an initial die shear strength of 7.8 N and a die shear strength of 7.6 N after an environmental test at 60° C. and 90% RH for 500 hours. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "good" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "good".

Example 3

An anisotropic conductive adhesive was prepared as in Example 1 except that the acrylic resin had a weight average molecular weight Mw of 200,000 and was used to obtain a mounted LED sample.

Table 1 shows the evaluation results for Example 3. The anisotropic conductive adhesive was white and had an initial total reflectance of 75% and a total reflectance of 74% after an environmental test at 100° C. for 1,000 hours. The anisotropic conductive adhesive also had an initial peel strength of 3.5 N and a peel strength of 3.1 N after an environmental test at 60° C. and 90% RH for 500 hours. The mounted LED sample had an initial die shear strength of 7.5 N and a die shear strength of 7.6 N after an environmental test at 60° C. and 90% RH for 500 hours. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "good" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "good".

Example 4

An anisotropic conductive adhesive was prepared as in Example 1 except that the acrylic resin had a weight average molecular weight Mw of 50,000 and was used to obtain a mounted LED sample.

Table 1 shows the evaluation results for Example 4. The anisotropic conductive adhesive was white and had an initial total reflectance of 71% and a total reflectance of 71% after an environmental test at 100° C. for 1,000 hours. The anisotropic conductive adhesive also had an initial peel strength of 3.8 N and a peel strength of 3.3 N after an environmental test at 60° C. and 90% RH for 500 hours. The mounted LED sample had an initial die shear strength of 6.9 N and a die shear strength of 7.1 N after an environmental test at 60° C. and 90% RH for 500 hours. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "good" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "good".

Example 5

A mounted LED sample was fabricated as in Example 1 except that the wiring substrate had ITO wiring with a pitch of 50 μm (50 μm ITO wiring-25 μm polyimide (PI) layer-50 μm Al base).

Table 1 shows the evaluation results for Example 5. The anisotropic conductive adhesive was white and had an initial total reflectance of 75% and a total reflectance of 74% after an environmental test at 100° C. for 1,000 hours. In the measurement of die shear strength, the mounted LED sample failed at the interface between the ITO and the substrate and had good adhesive strength between the adhesive and the ITO. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "good" for conductivity evaluation after 1,000 cycles in a temperature cycle test. The mounted LED sample was rated as "good" for conductivity evaluation after an environmental test at 60° C. and 90% RH for 500 hours. The overall evaluation was "good".

Comparative Example 1

An anisotropic conductive adhesive was prepared as in Example 1 except that the acrylic resin had a weight average molecular weight Mw of 200,000 and contained 0% by weight of acrylic acid (AA) (BA: 15%, EA: 64%, AN: 20%, AA: 0 w %, HEMA: 1 wt %, Mw: 200,000) and was used to obtain a mounted LED sample.

Table 1 shows the evaluation results for Comparative Example 1. The anisotropic conductive adhesive was white and had an initial total reflectance of 73% and a total reflectance of 72% after an environmental test at 100° C. for 1,000 hours. The anisotropic conductive adhesive also had an initial peel strength of 0.9 N and a peel strength of 1.1 N after an environmental test at 60° C. and 90% RH for 500 hours. The mounted LED sample had an initial die shear strength of 6.1 N and a die shear strength of 5.3 N after an environmental test at 60° C. and 90% RH for 500 hours. The mounted LED sample was rated as "good" for initial conductivity evaluation, as "good" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "poor".

Comparative Example 2

An anisotropic conductive adhesive was prepared as in Example 1 except that the acrylic resin had a weight average molecular weight Mw of 200,000 and contained 0% by weight of acrylic acid (AA) and 0% by weight of 2-hydroxyethyl methacrylate (HEMA) (BA: 15%, EA: 65%, AN: 20%, AA: 0 w %, HEMA: 0 wt %, Mw: 200,000) and was used to obtain a mounted LED sample.

Table 1 shows the evaluation results for Comparative Example 2. The anisotropic conductive adhesive was white and had an initial total reflectance of 74% and a total reflectance of 74% after an environmental test at 100° C. for 1,000 hours. The anisotropic conductive adhesive also had an initial peel strength of less than 0.5 N and a peel strength of less than 0.5 N after an environmental test at 60° C. and 90% RH for 500 hours. The mounted LED sample had an initial die shear strength of 4.5 N and a die shear strength of 3.9 N after an environmental test at 60° C. and 90% RH for 500 hours. The mounted LED sample was rated as "good" for initial conductivity evaluation, as "good" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "poor".

Comparative Example 3

An anisotropic conductive adhesive was prepared by dispersing 10 parts by mass of conductive particles (AUL704, Sekisui Chemical Co., Ltd.) in an adhesive containing 50 parts by mass of an alicyclic epoxy compound (Celloxide 2021P, Daicel Corporation), 40 parts by mass of an acid anhydride curing agent (methylhexahydrophthalic anhydride), and 3 parts by mass of an acrylic resin (BA: 15%, EA: 63%, AN: 20%, AA: 1 w %, HEMA: 1 wt %, Mw: 700,000). A mounted LED sample was fabricated by curing the anisotropic conductive adhesive at 230° C. and 1.5 N for 30 seconds.

Table 1 shows the evaluation results for Comparative Example 3. The anisotropic conductive adhesive was white and had an initial total reflectance of 75% and a total reflectance of 75% after an environmental test at 100° C. for 1,000 hours. The anisotropic conductive adhesive also had an initial peel strength of 1.6 N and a peel strength of 1.3 N after an environmental test at 60° C. and 90% RH for 500 hours. The mounted LED sample had an initial die shear strength of 7.2 N and a die shear strength of 6.3 N after an environmental test at 60° C. and 90% RH for 500 hours. The mounted LED sample was rated as "good" for initial conductivity evaluation, as "poor" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "poor" for conductivity evaluation after an environmental test at 60° C. and 90% RH for 500 hours. The overall evaluation was "poor".

Comparative Example 4

An anisotropic conductive adhesive was prepared as in Comparative Example 3 except that the acrylic resin had a weight average molecular weight Mw of 200,000 and contained 0% by weight of acrylic acid (AA) and 0% by weight of 2-hydroxyethyl methacrylate (HEMA) (BA: 15%, EA: 65%, AN: 20%, AA: 0 w %, HEMA: 0 wt %, Mw: 200,000) and was used to obtain a mounted LED sample.

Table 1 shows the evaluation results for Comparative Example 4. The anisotropic conductive adhesive was white and had an initial total reflectance of 77% and a total reflectance of 77% after an environmental test at 100° C. for 1,000 hours. The anisotropic conductive adhesive also had an initial peel strength of less than 0.5 N and a peel strength of less than 0.5 N after an environmental test at 60° C. and 90% RH for 500 hours. The mounted LED sample had an initial die shear strength of 3.8 N and a die shear strength of 3.2 N after an environmental test at 60° C. and 90% RH for 500 hours. The mounted LED sample was rated as "good" for initial conductivity evaluation, as "poor" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "poor" for conductivity evaluation after an environmental test at 60° C. and 90% RH for 500 hours. The overall evaluation was "poor".

Comparative Example 5

An anisotropic conductive adhesive was prepared as in Example 1 except that the alicyclic epoxy compound was replaced with 100 parts by mass of a cycloolefin and was used to obtain a mounted LED sample. The mounted LED sample was fabricated by curing the anisotropic conductive adhesive at 180° C. and 1.5 N for 240 seconds.

Table 1 shows the evaluation results for Comparative Example 5. The anisotropic conductive adhesive was yellow and had an initial total reflectance of 61% and a total reflectance of 32% after an environmental test at 100° C. for 1,000 hours. The anisotropic conductive adhesive also had an initial peel strength of 1.2 N and a peel strength of 1.4 N after an environmental test at 60° C. and 90% RH for 500 hours. The mounted LED sample had an initial die shear strength of 7.2 N and a die shear strength of 6.5 N after an environmental test at 60° C. and 90% RH for 500 hours. The mounted LED sample was rated as "good" for initial conductivity evaluation, as "poor" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "good" for conductivity evaluation after an environmental test at 60° C. and 90% RH for 500 hours. The overall evaluation was "poor".

Comparative Example 6

An anisotropic conductive adhesive was prepared as in Example 1 except that the alicyclic epoxy compound was replaced with a bisphenol F epoxy compound, the latent cationic curing agent was replaced with an anionic curing agent (amine curing agent), and no acrylic resin was added. The anisotropic conductive adhesive was used to obtain a mounted LED sample. The mounted LED sample was fabricated by curing the anisotropic conductive adhesive at 150° C. and 1.5 N for 30 seconds.

Table 1 shows the evaluation results for Comparative Example 6. The anisotropic conductive adhesive was yellow and had an initial total reflectance of 58% and a total reflectance of 15% after an environmental test at 100° C. for 1,000 hours. The anisotropic conductive adhesive also had an initial peel strength of 1.4 N and a peel strength of less than 0.1 N after an environmental test at 60° C. and 90% RH for 500 hours. The mounted LED sample had an initial die shear strength of 6.8 N and a die shear strength of 1.1 N after an environmental test at 60° C. and 90% RH for 500 hours. The mounted LED sample was rated as "good" for initial conductivity evaluation, as "good" for conductivity evaluation after 100 cycles in a temperature cycle test, as "poor" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "poor" for conductivity evaluation after an environmental test at 60° C. and 90% RH for 500 hours. The overall evaluation was "poor".

Comparative Example 7

An anisotropic conductive adhesive was prepared as in Comparative Example 6 except that an acrylic resin (BA: 15%, EA: 63%, AN: 20%, AA: 1 w %, HEMA: 1 wt %, Mw: 700,000) was added in an amount of 3 parts by mass and was used to obtain a mounted LED sample.

Table 1 shows the evaluation results for Comparative Example 7. The anisotropic conductive adhesive was yellow and had an initial total reflectance of 53% and a total reflectance of 11% after an environmental test at 100° C. for 1,000 hours. The anisotropic conductive adhesive also had an initial peel strength of 2.5 N and a peel strength of less than 0.1 N after an environmental test at 60° C. and 90% RH for 500 hours. The mounted LED sample had an initial die shear strength of 7.1 N and a die shear strength of 0.4 N after an environmental test at 60° C. and 90% RH for 500 hours. The mounted LED sample was rated as "good" for initial conductivity evaluation, as "good" for conductivity evaluation after 100 cycles in a temperature cycle test, as "good" for conductivity evaluation after 500 cycles in a temperature cycle test, and as "poor" for conductivity evaluation after 1,000 cycles in a temperature cycle test. The mounted LED sample was rated as "good" for conductivity evaluation after an environmental test at 100° C. for 1,000 hours and as "poor" for conductivity evaluation after an environmental test at 60° C. and 90% RH for 500 hours. The overall evaluation was "poor".

TABLE 1

| | | Example 1 | Example 2 | Example 3 | Example 4 | Example 5 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|---|---|---|
| Base parts by mass | Alicyclic epoxy | 100 | 100 | 100 | 100 | 100 | 100 | 100 | 50 | 50 | — | — | — |
| | Cycloolefin | — | — | — | — | — | — | — | — | — | 100 | — | — |
| | Bisphenol F epoxy | — | — | — | — | — | — | — | — | — | — | 100 | 100 |
| Curing agent parts by mass | Latent cationic curing agent | 5 | 5 | 5 | 5 | 5 | 5 | 5 | — | — | 5 | — | — |
| | Anionic curing agent | — | — | — | — | — | — | — | — | — | — | 5 | 5 |
| | Acid anhydride curing agent | — | — | — | — | — | — | — | 40 | 40 | — | — | — |
| Acrylic resin parts by mass | AA: 1 wt %, HEMA: 1 wt % Mw: 700,000 | 3 | — | — | — | 3 | — | — | 3 | — | 3 | — | 3 |
| | AA: 1 wt %, HEMA: 1 wt % Mw: 500,000 | — | 3 | — | — | — | — | — | — | — | — | — | — |
| | AA: 1 wt %, HEMA: 1 wt % Mw: 200,000 | — | — | 3 | — | — | — | — | — | — | — | — | — |
| | AA: 1 wt %, HEMA: 1 wt % Mw: 50,000 | — | — | — | 3 | — | — | — | — | — | — | — | — |
| | AA: 0 wt %, HEMA: 1 wt % Mw: 200,000 | — | — | — | — | — | 3 | — | — | — | — | — | — |
| | AA: 0 wt %, HEMA: 0 wt % Mw: 200,000 | — | — | — | — | — | — | 3 | — | 3 | — | — | — |
| Conductive particles parts by mass | | 10 | 10 | 10 | 10 | 10 | 10 | 10 | 10 | 10 | 10 | 10 | 10 |
| Color of anisotropic conductive adhesive | | White | White | White | White | White | White | White | White | White | Yellow | Yellow | Yellow |
| Total reflectance | Initial [%] | 75 | 73 | 75 | 71 | 75 | 73 | 74 | 75 | 77 | 61 | 58 | 53 |
| | 100° C., 1000 h [%] | 74 | 73 | 74 | 71 | 74 | 72 | 74 | 75 | 77 | 32 | 15 | 11 |
| Peel strength | Initial [N] | 4.0 | 3.1 | 3.5 | 3.8 | — | 0.9 | <0.5 | 1.6 | <0.5 | 1.2 | 1.4 | 2.5 |
| | 60° C., 90% Rh, 500 h [N] | 4.1 | 2.9 | 3.1 | 3.3 | — | 1.1 | <0.5 | 1.3 | <0.5 | 1.4 | <0.1 | <0.1 |
| Die shear strength | Initial [N] | 8.5 | 7.8 | 7.5 | 6.9 | Material failure | 6.1 | 4.5 | 7.2 | 3.8 | 7.2 | 6.8 | 7.1 |
| | 60° C., 90% Rh, 500 h [N] | 5.3 | 7.6 | 7.6 | 7.1 | Material failure | 5.3 | 3.9 | 6.3 | 3.2 | 6.5 | 1.1 | 0.4 |
| Conductivity evaluation | Initial | Good | Good | Good | Good | Good | Good | Good | Good | Good | Good | Good | Good |
| | TCT 100 cyc | Good | Good | Good | Good | Good | Good | Good | Poor | Poor | Poor | Good | Good |
| | TCT 500 cyc | Good | Good | Good | Good | Good | Poor | Poor | Poor | Poor | Poor | Poor | Good |
| | TCT 1000 cyc | Good | Good | Good | Good | Good | Poor | Poor | Poor | Poor | Poor | Poor | Poor |
| | 100° C., 1000 h | Good | Good | Good | Good | — | Good | Good | Good | Good | Good | Good | Good |
| | 60° C., 90% Rh, 500 h | Good | Good | Good | Good | Good | Good | Good | Poor | Poor | Good | Poor | Poor |
| Overall evaluation | | Good | Good | Good | Good | Good | Poor | Poor | Poor | Poor | Poor | Poor | Poor |

The anisotropic conductive adhesives of Comparative Examples 1 and 2, which contained an acrylic resin containing no acrylic acid (AA) or 2-hydroxyethyl methacrylate (HEMA), had low adhesive strength to aluminum and low conduction reliability.

The anisotropic conductive adhesives of Comparative Examples 3 and 4, which contained an acid anhydride curing agent, had low conduction reliability after an environmental test at 60° C. and 90% RH for 500 hours. A comparison between Comparative Examples 3 and 4 also shows that it is preferred to use an acrylic resin containing AA and HEMA, as in the comparison between Comparative Examples 1 and 2 and the Examples.

The anisotropic conductive adhesive of Comparative Example 5, which contained a cycloolefin base, reacted slowly and required an extended period of time for curing. This anisotropic conductive adhesive was not white because of the color of the resin itself and discoloration due to double bonds and also had low conduction reliability.

The anisotropic conductive adhesives of Comparative Examples 6 and 7 had adhesion to aluminum due to the polar effect of the amine curing agent. These anisotropic conductive adhesives, however, were susceptible to humidity and had low conduction reliability after an environmental test at 60° C. and 90% RH for 500 hours. The anisotropic conductive adhesives also had low whiteness because of the discoloration of the amine.

The anisotropic conductive adhesives of Examples 1 to 5, which contained an alicyclic epoxy compound, a latent cationic curing agent, and an acrylic resin containing acrylic acid (AA) and 2-hydroxyethyl methacrylate (HEMA), had properties suitable for optical applications and high adhesive strength and conduction reliability for aluminum wiring and ITO wiring covered with oxide films.

REFERENCE SIGNS LIST 11 wiring, 12 epoxy compound sea part, 13 acrylic resin island part, 21 substrate, 22 wiring pattern, 23 light-emitting element, 24 n-electrode, 25 p-electrode, 26 bump, 30 anisotropic conductive film, 50 anisotropic conductive adhesive, 51 wiring substrate, 52 LED chip, 53 heating tool, 54 tool

The invention claimed is:

1. A light-emitting device comprising:
a substrate having a wiring pattern comprising aluminum;
an anisotropic conductive film formed on an electrode of the wiring pattern; and
a light-emitting element mounted on the anisotropic conductive film,
the anisotropic conductive film comprising an anisotropic conductive adhesive comprising:
at least one of an alicyclic epoxy compound and an hydrogenated epoxy compound,
a cationic catalyst,
an acrylic resin having a weight average molecular weight of 50,000 to 900,000, and
conductive particles,
wherein the acrylic resin comprises 0.5% to 10% by weight of acrylic acid and 0.5% to 10% by weight of a hydroxyl-group-containing acrylic acid ester, and
wherein said anisotropic conductive adhesive is present in cured form.

2. The light-emitting device according to claim 1, wherein the acrylic resin is present in an amount of 1 to 10 parts by mass per 100 parts by mass of the epoxy compound.

3. The light-emitting device according to claim 1, wherein the hydroxyl-group-containing acrylic acid ester is at least one compound selected from the group consisting of 2-hydroxyethyl methacrylate, 2-hydroxypropyl methacrylate, 2-hydroxyethyl acrylate, and 2-hydroxypropyl acrylate.

4. The light-emitting device according to claim 1, wherein the acrylic resin further comprises at least one acrylic acid ester selected from butyl acrylate, ethyl acrylate, and ethyl acrylate.

5. The light-emitting device according to claim 1, wherein the cationic catalyst is an aluminum chelate latent curing agent.

6. The light-emitting device according to claim 1, wherein the anisotropic conductive adhesive comprises the alicyclic epoxy compound.

7. The light-emitting device according to claim 1, wherein the anisotropic conductive adhesive comprises the hydrogenated epoxy compound.

8. The light-emitting device according to claim 1, wherein the conductive particles have an average particle size of 1 to 10 μm and an average particle density of the conductive particles in the adhesive is 1,000 to 100,000 particles/mm$^2$.

9. The light-emitting device according to claim 1, wherein the conductive particles have an average particle size of 2 to 6 μm and an average particle density of the conductive particles in the adhesive is 30,000 to 80,000 particles/mm$^2$.

10. The light-emitting device according to claim 1, wherein the anisotropic conductive adhesive comprises the alicyclic epoxy compound and the hydrogenated epoxy compound.

11. A light-emitting device comprising:
a transparent substrate having a wiring pattern comprising a transparent conductive film;
an anisotropic conductive film formed on an electrode of the wiring pattern; and
a light-emitting element mounted on the anisotropic conductive film,
the anisotropic conductive film comprising an anisotropic conductive adhesive comprising:
at least one of an alicyclic epoxy compound and an hydrogenated epoxy compound,
a cationic catalyst,
an acrylic resin having a weight average molecular weight of 50,000 to 900,000, and
conductive particles,
wherein the acrylic resin comprises 0.5% to 10% by weight of acrylic acid and 0.5% to 10% by weight of a hydroxyl-group-containing acrylic acid ester, and
wherein said anisotropic conductive adhesive is present in cured form.

12. The light-emitting device according to claim 11, wherein the acrylic resin is present in an amount of 1 to 10 parts by mass per 100 parts by mass of the epoxy compound.

13. The light-emitting device according to claim 11, wherein the hydroxyl-group-containing acrylic acid ester is at least one compound selected from the group consisting of 2-hydroxyethyl methacrylate, 2-hydroxypropyl methacrylate, 2-hydroxyethyl acrylate, and 2-hydroxypropyl acrylate.

14. The light-emitting device according to claim 11, wherein the acrylic resin further comprises at least one acrylic acid ester selected from butyl acrylate, ethyl acrylate, and ethyl acrylate.

15. The light-emitting device according to claim 11, wherein the cationic catalyst is an aluminum chelate latent curing agent.

16. The light-emitting device according to claim 11, wherein the anisotropic conductive adhesive comprises the alicyclic epoxy compound.

17. The light-emitting device according to claim 11, wherein the anisotropic conductive adhesive comprises the hydrogenated epoxy compound.

18. The light-emitting device according to claim 11, wherein the conductive particles have an average particle size of 1 to 10 μm and an average particle density of the conductive particles in the adhesive is 1,000 to 100,000 particles/mm$^2$.

19. The light-emitting device according to claim 11, wherein the conductive particles have an average particle size of 2 to 6 μm and an average particle density of the conductive particles in the adhesive is 30,000 to 80,000 particles/mm$^2$.

20. The light-emitting device according to claim 11, wherein the anisotropic conductive adhesive comprises the alicyclic epoxy compound and the hydrogenated epoxy compound.

* * * * *